United States Patent
Mackler

(10) Patent No.: US 8,104,203 B2
(45) Date of Patent: Jan. 31, 2012

(54) SOLAR POWER GENERATION DISPLAY ASSEMBLY AND METHOD FOR PROVIDING SAME

(75) Inventor: Laurence Mackler, New York, NY (US)

(73) Assignee: Solaire Generation, Inc., New York, NY (US)

( * ) Notice: Subject to any disclaimer, the term of this patent is extended or adjusted under 35 U.S.C. 154(b) by 7 days.

(21) Appl. No.: 12/497,392

(22) Filed: Jul. 2, 2009

(65) Prior Publication Data

US 2010/0000134 A1 Jan. 7, 2010

Related U.S. Application Data

(60) Provisional application No. 61/077,851, filed on Jul. 2, 2008.

(51) Int. Cl.
*G09F 7/00* (2006.01)
*G09F 11/02* (2006.01)

(52) U.S. Cl. ............... 40/492; 40/493; 40/503; 40/505; 40/506

(58) Field of Classification Search .............. 40/492, 40/493, 503, 505, 506
See application file for complete search history.

(56) References Cited

U.S. PATENT DOCUMENTS

| | | | |
|---|---|---|---|
| 4,132,074 A | 1/1979 | Wendel | |
| 4,149,523 A | 4/1979 | Boy-Marcotte et al. | |
| 4,215,501 A * | 8/1980 | Meijer | 40/559 |
| 4,245,895 A | 1/1981 | Wildenrotter | |
| 4,281,369 A | 7/1981 | Batte | |
| 4,319,310 A | 3/1982 | Kingsley | |
| 4,384,317 A | 5/1983 | Stackpole | |
| 4,429,178 A | 1/1984 | Prideaux et al. | |
| 4,432,341 A | 2/1984 | Howe et al. | |
| 4,453,327 A | 6/1984 | Clarke | |
| 4,484,104 A | 11/1984 | O'Brien | |
| 4,611,090 A | 9/1986 | Catella et al. | |
| 4,636,577 A | 1/1987 | Peterpaul | |
| 4,649,899 A | 3/1987 | Moore | |

(Continued)

FOREIGN PATENT DOCUMENTS

CH 677415 A5 * 5/1991 ............... 40/473

(Continued)

OTHER PUBLICATIONS

Notification of Transmittal of the International Search Report and the Written Opinion of the International Searching Authority, or the Declaration, International Search Report and Written Opinion of the International Searching Authority, for related International Application No. PCT/US2009/049625.

(Continued)

*Primary Examiner* — Joanne Silbermann
*Assistant Examiner* — Syed A Islam
(74) *Attorney, Agent, or Firm* — Byrne Poh LLP

(57) ABSTRACT

The present invention relates to a solar power generation display assembly and methods for providing same involving solar arrays in a display of designated indicia, each solar array containing one or more electronically linked solar modules or cells of a crystalline or amorphous type and other modules. The solar modules and/or portions of the solar modules and other module portions and/or portions of the other module portions within each specific array or display may be static or manipulated electronically or mechanically to provide an enhanced indicia while a programmable display management system enables operation of electrical and mechanical management sub-systems for displaying the indicia.

21 Claims, 11 Drawing Sheets

U.S. PATENT DOCUMENTS

| | | | |
|---|---|---|---|
| 4,668,120 A | 5/1987 | Roberts | |
| 4,742,291 A | 5/1988 | Bobier et al. | |
| 4,827,645 A * | 5/1989 | Stamps, Jr. | 40/567 |
| 4,832,001 A | 5/1989 | Baer | |
| 4,835,918 A | 6/1989 | Dippel | |
| 4,841,278 A | 6/1989 | Tezuka et al. | |
| 4,867,133 A | 9/1989 | Sadler | |
| 4,966,631 A | 10/1990 | Matlin et al. | |
| 4,989,124 A | 1/1991 | Shappell | |
| 5,228,924 A | 7/1993 | Barker et al. | |
| D353,129 S | 12/1994 | Ricaud et al. | |
| 5,612,741 A | 3/1997 | Loban et al. | |
| 5,807,440 A | 9/1998 | Kubota et al. | |
| D408,554 S | 4/1999 | Dinwoodie | |
| 5,900,850 A | 5/1999 | Bailey et al. | |
| 6,046,401 A | 4/2000 | McCabe | |
| 6,049,035 A | 4/2000 | Tsuri et al. | |
| D425,013 S | 5/2000 | Lai | |
| 6,111,189 A | 8/2000 | Garvison | |
| 6,260,319 B1 | 7/2001 | Colomban | |
| 6,263,601 B1 | 7/2001 | Emert | |
| D452,328 S | 12/2001 | O'Brien | |
| D456,085 S | 4/2002 | O'Brien | |
| 6,455,767 B1 | 9/2002 | Muller | |
| 6,495,750 B1 | 12/2002 | Dinwoodie | |
| 6,518,493 B1 | 2/2003 | Murakami et al. | |
| 6,572,173 B2 | 6/2003 | Müller | |
| 6,631,591 B1 | 10/2003 | Durham | |
| 6,784,357 B1 | 8/2004 | Wang | |
| D505,113 S | 5/2005 | Lam | |
| 6,930,237 B2 | 8/2005 | Mattiuzzo | |
| D511,576 S | 11/2005 | Shingleton et al. | |
| D535,584 S | 1/2007 | Garrett | |
| 7,227,078 B2 | 6/2007 | Jongerden et al. | |
| 7,237,360 B2 | 7/2007 | Moncho et al. | |
| D564,443 S | 3/2008 | Moore | |
| D565,505 S | 4/2008 | Shugar et al. | |
| D571,716 S | 6/2008 | Anderson | |
| D584,223 S | 1/2009 | Cooper | |
| 7,501,713 B2 | 3/2009 | Fein et al. | |
| 7,509,762 B2 * | 3/2009 | Ajumobi | 40/503 |
| 2004/0065025 A1 | 4/2004 | Durham | |
| 2005/0035244 A1 | 2/2005 | Conger | |
| 2005/0045244 A1 | 3/2005 | Hartness et al. | |
| 2005/0109384 A1 | 5/2005 | Shingleton et al. | |
| 2005/0241246 A1 | 11/2005 | Sinha et al. | |
| 2006/0011194 A1 | 1/2006 | Hensley et al. | |
| 2006/0090858 A1 | 5/2006 | Heidenreich | |
| 2006/0101683 A1 | 5/2006 | Baker | |
| 2006/0207192 A1 | 9/2006 | Durham | |
| 2006/0225776 A1 | 10/2006 | Nemazi et al. | |
| 2007/0212935 A1 | 9/2007 | Lenox | |
| 2008/0216418 A1 | 9/2008 | Durham | |
| 2008/0308091 A1 | 12/2008 | Corio | |
| 2009/0050194 A1 | 2/2009 | Noble et al. | |

FOREIGN PATENT DOCUMENTS

| | | |
|---|---|---|
| WO | 9736132 A1 | 10/1997 |

OTHER PUBLICATIONS

Notification of Transmittal of the International Search Report and the Written Opinion of the International Searching Authority, or the Declaration, International Search Report and Written Opinion of the International Searching Authority, for related International Application No. PCT/US2009/049595.

* cited by examiner

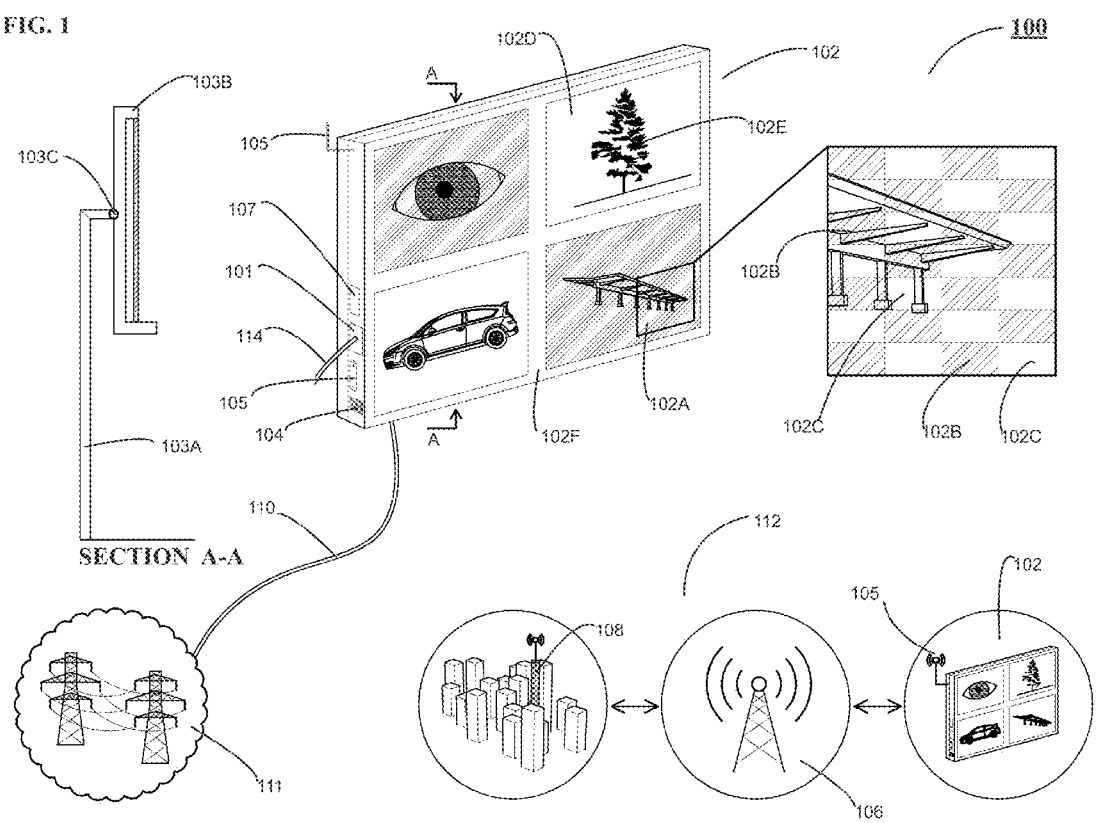

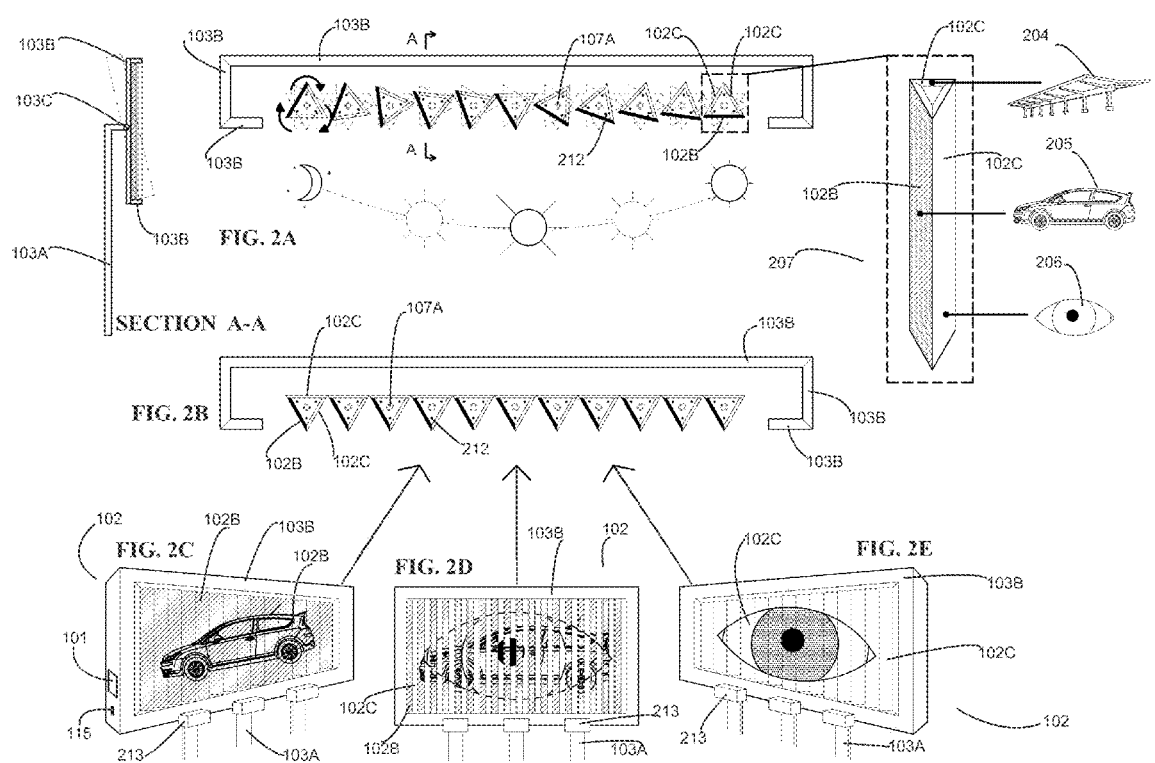

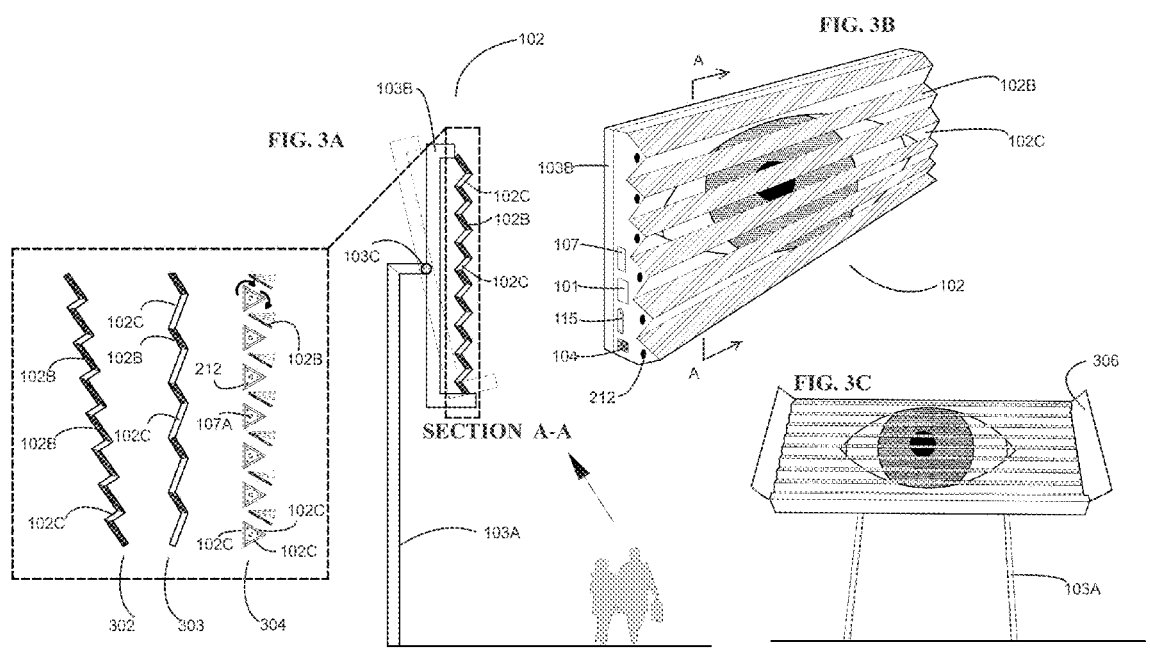

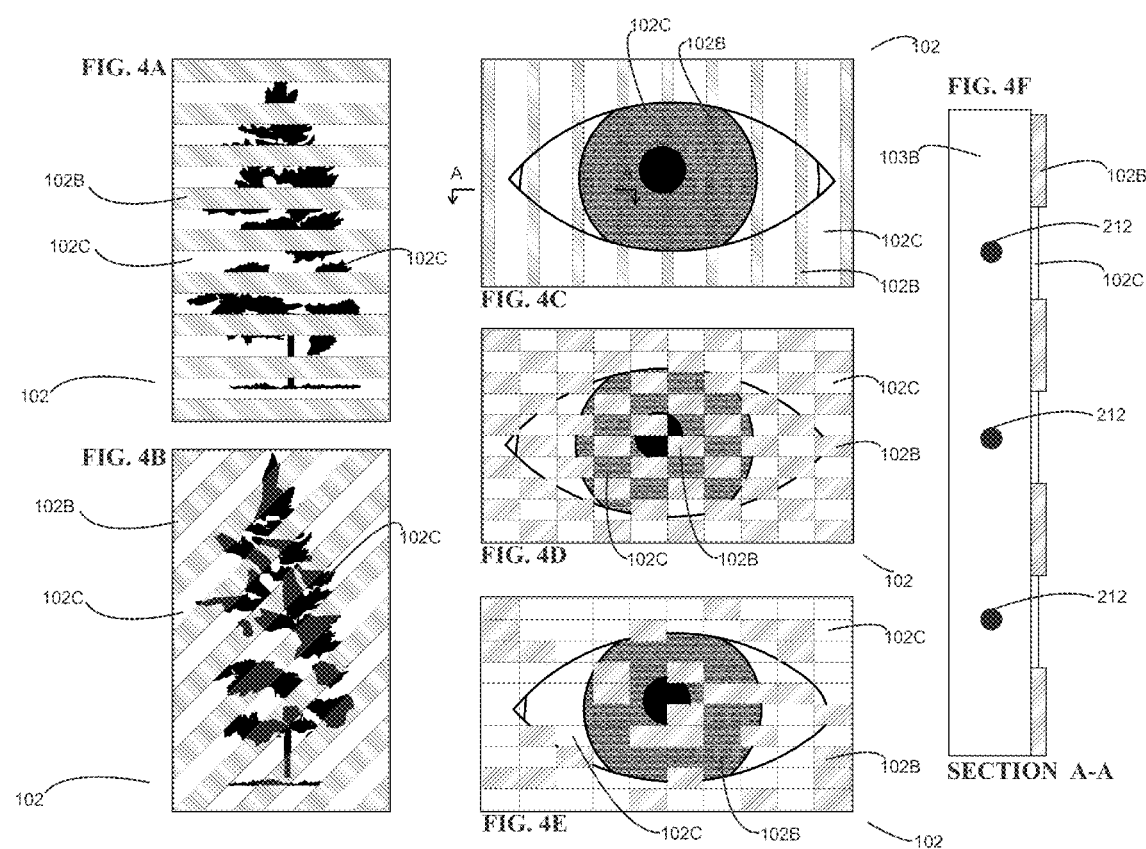

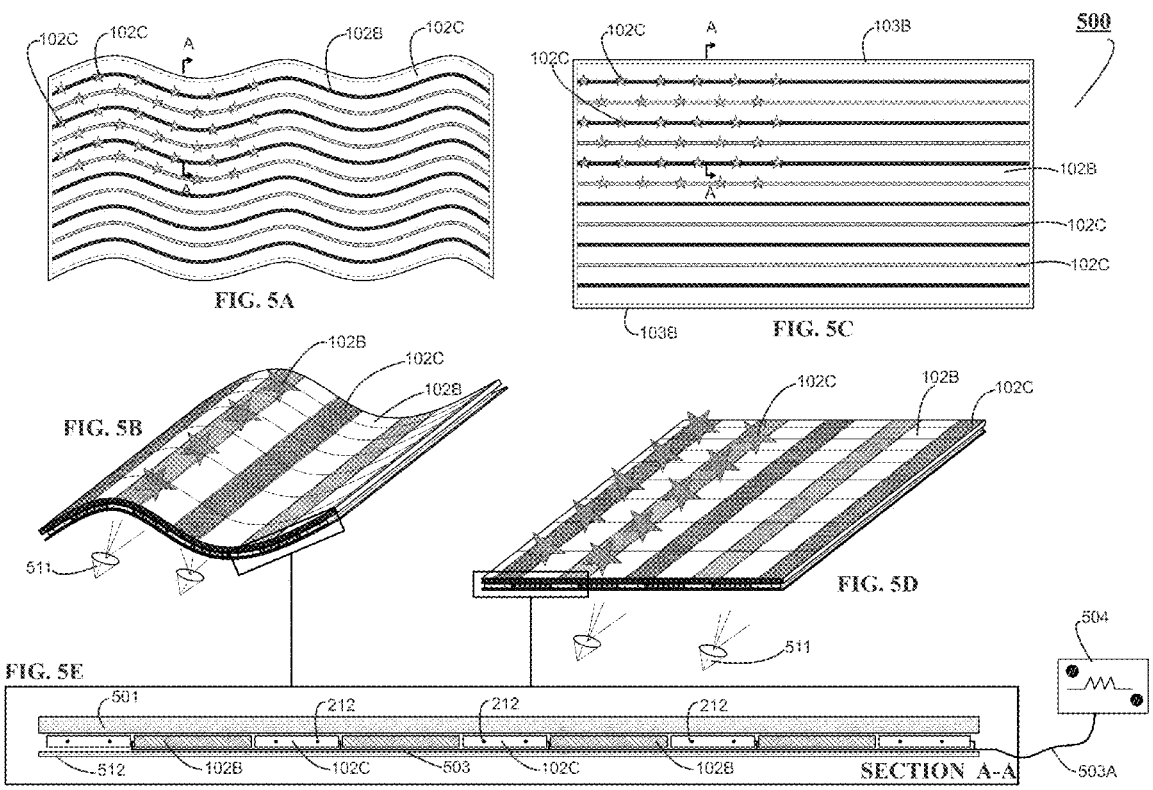

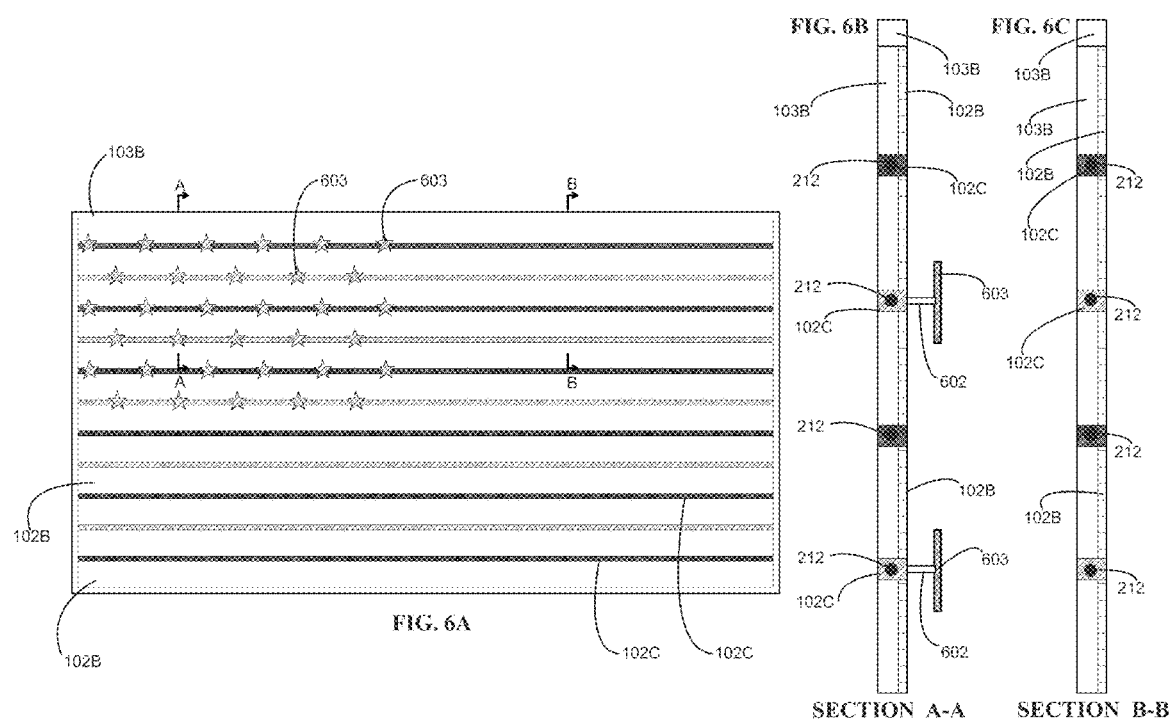

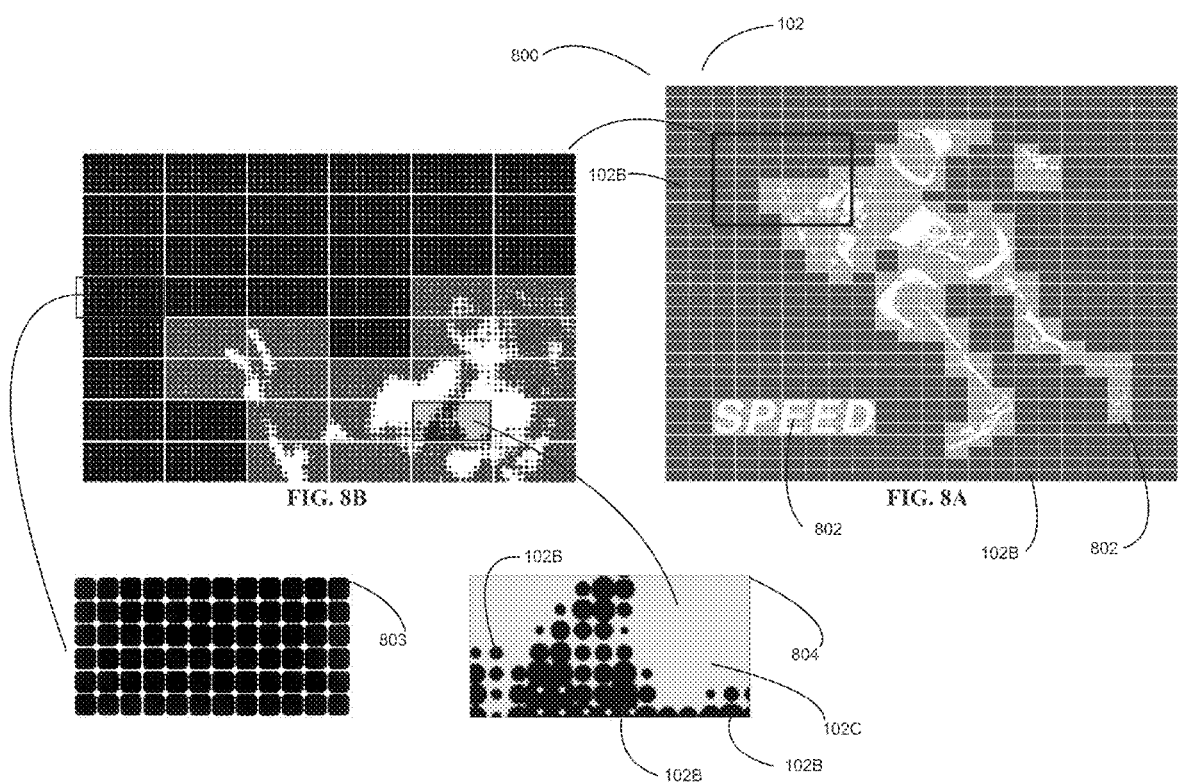

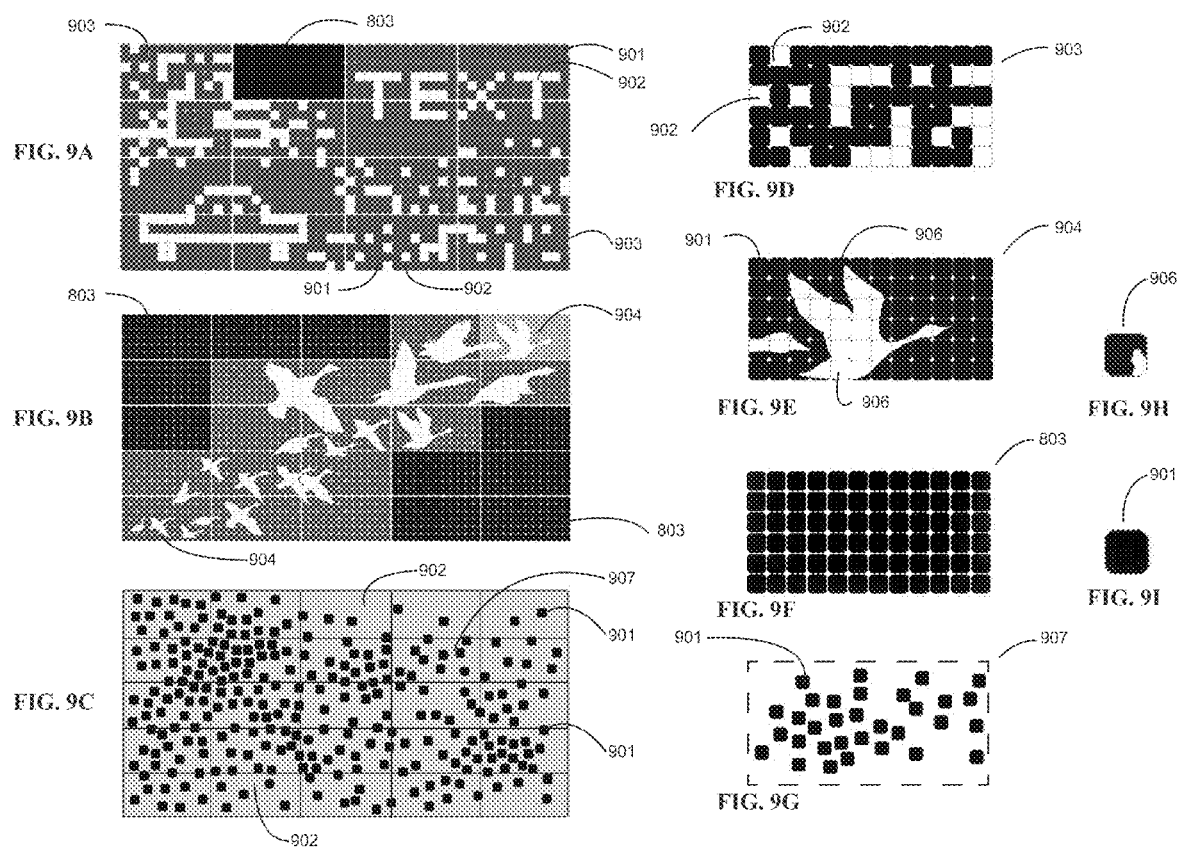

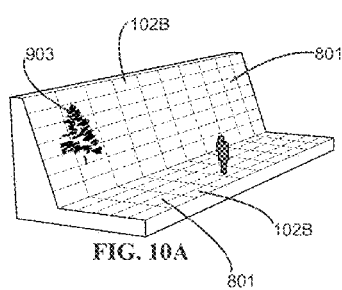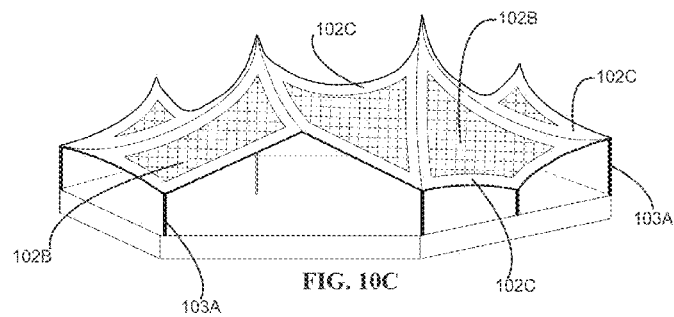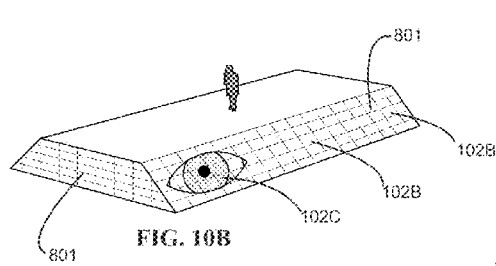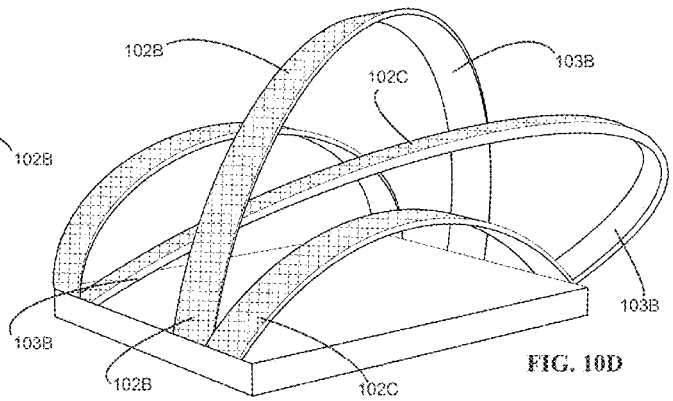

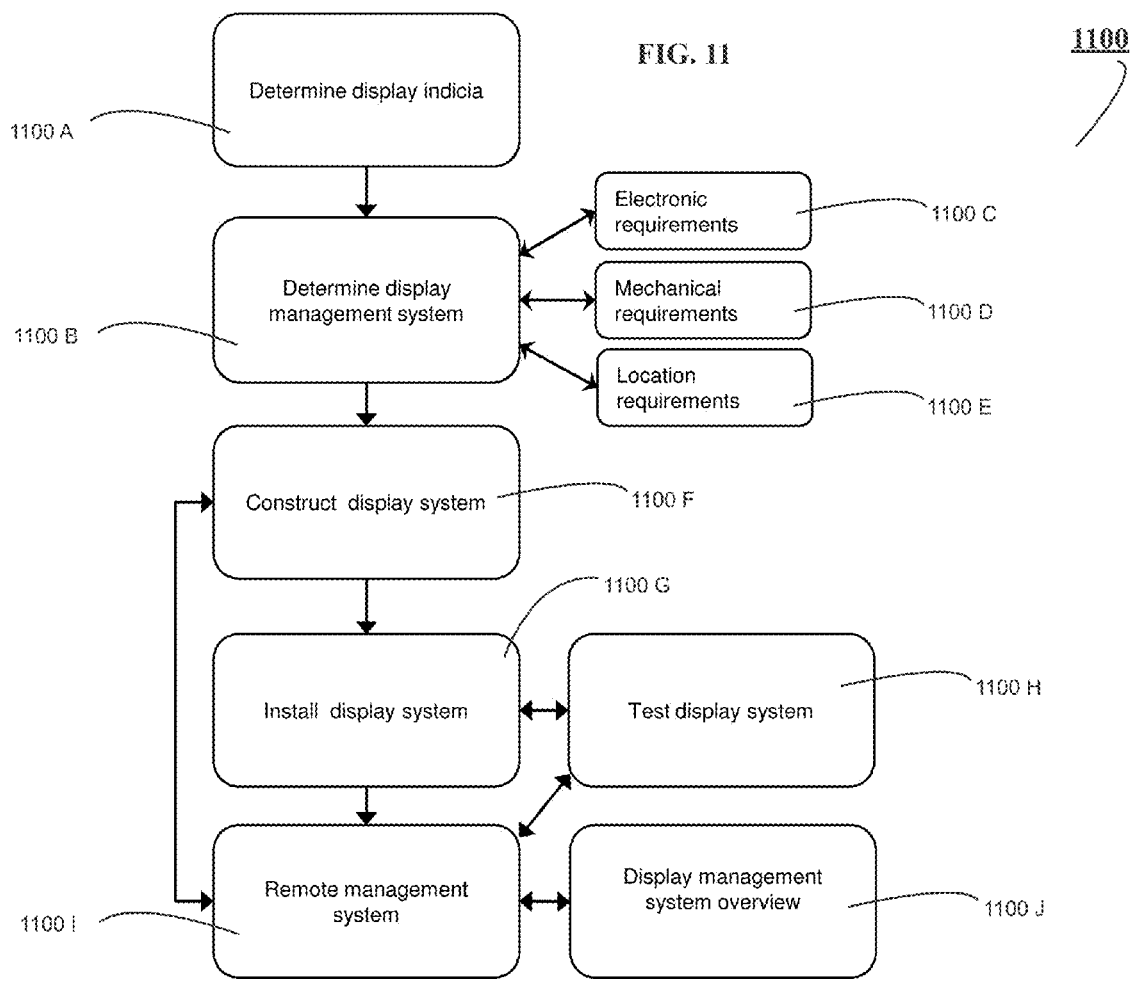

SOLAR POWER GENERATION DISPLAY ASSEMBLY AND METHOD FOR PROVIDING SAME

RELATED APPLICATIONS

This application claims priority to U.S. Provisional Application Ser. No. 61/077,851, filed Jul. 2, 2008, entitled "ADVERTISING AND PROMOTIONAL SYSTEM INVOLVING SOLAR ARRAYS AND VISUAL INDICIA AND METHODS FOR MANUFACTURING THE SAME," which is incorporated herein by reference. This application is also related to PCT Application No. PCT/US2009/049595, entitled "SOLAR POWER GENERATION DISPLAY ASSEMBLY AND METHOD FOR PROVIDING SAME," filed on the same day as this application.

BACKGROUND OF THE INVENTION

1. Field of the Invention

The present invention relates to a solar power generation display assembly and methods for providing the same. More specifically, the present invention relates to displays for adaptive visual indicia involving multi-use structures such as car canopies, billboards, branched or stalk-type advertising structures, and suspended media (including flags) where visual indicia is linked to solar energy enhanced power supply.

2. Description of the Related Art

To improve the quality and economic value of media, promotional, entertainment, decorative and other installations it is desirable to develop means to provide multi-use structures to facilitate such things as mounting for electricity generating photovoltaic (PV) modules, image display technology, decorative and other elements. Where open space for PV system installation is limited or restricted there is a need to incorporate PV into multi-use structures such as displays, billboards, decorative installations and other structures.

The improving economic feasibility of photovoltaic power systems, the need for sources of clean energy and the social benefit of increasingly public awareness of the same has led to an increasing world market for PV systems. There are also ancillary benefits of clean energy production, or energy production without carbon emissions, as discussed in the relevant scientific literature.

The existing market for advertising and media placement has become increasing populated with electronic and digital signage formats; this market would benefit from the addition of energy-generating media systems and methods. Multipurpose media would refresh interest in the media itself and in the energy generation capabilities of the system.

The related art involves the use of solar powered billboards. In this type of related art, a traditional billboard with printed or painted indicia is secured to a rigid planar surface (typically suspended above the ground) and lighted by incandescent, fluorescent, gas-plasma, or arc-type lighting. Secured near to the rigid planar surface is a solar array containing a plurality of electrically linked solar cells constructed from crystalline or amorphous silica. See for example the arrays at www.solarpowerauthoritiy.com/archives/2008/. In one adaptive example shown at this site, the rigid solar arrays are fixed to the rigid planar surface.

In operation, these types of solar arrays generate DC power at a variable rate depending upon the available solar energy received, and are therefore necessarily linked with the centralized power-supply grid to provide power during the night time. Those of skill in the advertising arts will recognize the night time as being a particularly desirable time to advertise which requires heavy power supply. Unfortunately, there is no solar energy supplied during the night and so such operations necessarily require a grid-based power draw to work.

As an additional detriment, this type of related advertising display requires that the solar array system takes up or otherwise occupies the space employed for the advertising indicia (the billboard) or takes up space that must be rented at a fee from the owner of the billboard system. As a result, the solar array-rigid billboards are often much more expensive and more difficult to operate than simple traditional billboards with a lighting system.

Another type of related art are so-called 'solar' textiles that are currently under speculation at www.cnn.com/2008/TECH/science/07/01/solar.textiles/index.html where a thin-film photovoltaic material (solar energy generating material) is woven into a textile itself where the textile product (a curtain or sun-shade) would also include the complex flexible wiring to link the power generation to a rechargeable battery source. The concept noted is that the stored battery energy would later be downloaded into a larger home battery system.

A number of detriments are recognized for this related art discussion, including the easy damage and breakdown of the electrical connections between the solar material and the power supplies, thereby rendering the entire textile product inoperable, and the easy damage to the suspending textile itself, thereby causing a structural failure. Similarly, a substantial detriment is the extreme cost of such a textile that would likely fail in the practical environment. Necessarily, those of skill in the art recognize that this related art is in the infancy stage of development and is more speculative then fully developed.

What is not appreciated by the related art is the ability to employ solar arrays as display or advertising indicia itself, where large form advertising or display structures would employ selective positioning of both solar arrays and solar cellular structures to create an advertising image, or in the alternative allow the operational power supply for an advertising suspending structure of the type discussed below.

An additional solar system is known wherein field applied PV roofing laminates are attached to various structures to develop net metered or independent power. Examples are viewable at the Uni-Solar PVL Product Data Sheet produced by PC Power Systems, Inc.(www.affordable-solar.com/). These field-applied PV roofing systems are shown attached to walking shelters, vehicle shelters, schools, buildings, and apartment houses in various ways. In each case they generate power back to the system, but completely fail to be employable as any form of display or advertising indicia.

Accordingly, there is a need for an improved solar power generation display system involving solar arrays and visual indicia.

OBJECTS AND SUMMARY OF THE INVENTION

An object of the present invention is to provide a display system that employs selectable solar array details and a method for creating, installing, and managing such a system.

In accomplishing the foregoing and related objects, the invention provides an improved display system which combines photovoltaic systems with an aesthetically pleasing design, media placement and a plurality of other benefits/features. The present invention includes a plurality of photovoltaic modules, a support structure for photovoltaic modules, display indicia and decorative elements. In certain embodiments, the invention may be used to display multiple display indicia and/or decorative indicia and photovoltaic elements which can change with the time of day, movement of the sun or other user-determined schedule. In certain embodiments, the invention may be used to display multiple advertising and/or decorative indicia and photovoltaic elements and functions as a stage. In certain embodiments the invention may use flexible photovoltaic materials (e.g. thin film) upon which advertising and/or decorative indicia may be displayed.

The above, and other objects, features and advantages of the present invention will become apparent from the following description read in conjunction with the accompanying drawings, in which like reference numerals designate the same elements.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts and in which:

FIG. 1 relates to a system operation diagram of one embodiment of an operation system for managing a solar display system.

FIGS. 2A, 2B, 2C, 2D and 2E show two exemplary embodiments of aspects of the display system. FIG. 2A is a plan view of the display involving sun-tracking rotating display surfaces; FIG. 2B shows fixed-position display surfaces that rotate at night.

FIGS. 3A, 3B and 3C show an exemplary embodiment of the display system involving an angled array with alternating solar energy generating portions and display indicia portions.

FIGS. 4A, 4B, 4C, 4D, 4E and 4F show alternative embodiments of the display system. FIGS. 4A-4E show a plurality of arrangements of the photovoltaic and other materials to create and display the desired indicia; FIG. 4F is a horizontal section of the display in FIG. 4C.

FIGS. 5A, 5B, 5C, 5D and 5E show an alternative embodiment of the display system in the form of a thin-film PV flag. FIGS. 5A and 5B show the display system in the form of a flexible thin-film PV flag, and FIGS. 5D and 5E show the display system in the form of a rigid thin-film PV flag.

FIGS. 6A, 6B and 6C show an alternative embodiment of the display system in the form of a flag with a rigid backing.

FIGS. 7A, 7B, 8A and 8B show exemplary pixilated construction in creating pixilated images for solar array display indicia.

FIGS. 9A, 9B, 9C, 9D, 9E, 9F, 9G, 9H and 9I show exemplary dot matrix-type and graphic-type module construction in creating custom images for solar array display indicia.

FIGS. 10A, 10B, 10C and 10D shows four exemplary embodiments of the solar display system in the form of a performance or display stage.

FIG. 11 is a descriptive flow diagram of one embodiment of a method for creation of and system for operation of a solar display system with indicia.

DETAILED DESCRIPTION OF THE PREFERRED EMBODIMENTS

Figure 7B:

Reference will now be made in detail to several embodiments of the invention that are illustrated in the accompanying drawings. Wherever possible, same or similar reference numerals are used in the drawings and the description to refer to the same or like parts or steps. The drawings are in simplified form and are not to precise scale. For purposes of convenience and clarity only, directional terms, such as top, bottom, up, down, over, above, and below may be used with respect to the drawings. These and similar directional terms should not be construed to limit the scope of the invention in any manner. The words "connect," "couple," and similar terms with their inflectional morphemes do not necessarily denote direct and immediate connections, but may also include connections through mediate elements or devices.

Referring now to FIG. 1, exemplary embodiments of aspects of the proposed display systems with solar indicia are discussed to introduce initial concepts.

A display management system 100 integrates management operations from an electrical or electronic management system 101 based on an exemplary indicia display 102 comprising smaller display portions 102A, which may consist of a plurality of solar module portions 102B and other module portions 102C. Portions 102B may consist of any number of whole or partial solar modules, which in turn may consist of any number of whole or partial solar cells. Portions 102C may consist of any number of whole or partial non-solar panels or any other material. Portions 102B and 102C may or may not display indicia via any means, including but not limited to, use of an adhesive overlay, an opaque or translucent layer, a glass layer, an internal image, use of internal or external lighting, manipulation or arrangement of solar cells or other material cells, etching, or any other method of casting an image from the surface, interior or from behind the portions. The display 102 is mounted on a support structure 103 consisting of ground or building support member 103A and frame or backing 103B which may or may not include solar PV material or display indicia and may or may not include a hinge or pivot 103C, and a mechanical management system 104 for overall operating display management system 100.

Indicia display 102 may contain both solar module portions 102B and other module portions 102C. Other module portions 102C may be whole or partial traditional display indicia or displays such as lithographic images, photos, LCD displays or LED displays, or any other medium or material. Solar module portions 102B may consist of photovoltaic modules, photovoltaic thin film or any other energy producing material, or may also consist of decorative modules which are transparent or translucent, with or without decorative designs. Photovoltaic elements may be made of monocrystalline silicon, polycrystalline silicon, amorphous silicon, copper-indium-gallium-selenide (CIGS), thin film, or any other photovoltaic technology and may also be a passive or active solar thermal system. Display portions 102A in indicia display 102 may also include lighting or heating elements and may include a wide range of structures including pumps, water storage containers and other elements for water collection and drainage. It will be recognized that both solar portions and other module portions may be swapped-out and replaced in overall indicial display 102 to adapt the same rapidly to a predetermined display indicia for a customer upon their specification.

The indicial display is controlled by a remote communication system 112 that controls the display content and indicia. Indicia display 102 may be equipped with a hard-wired communication line 114 or a wireless antenna 105, each respectively and optionally for communicating via a communication link 106, shown as a cell tower, to a central management location 108 accessible via a web portal (not shown) or other means. In this way, an on-display central processing unit (CPU) 107 may be updated as to control instructions and may download and transmit operational data. In this way, it will be recognized that management location 108 may readily update and change the visual display on indicia display 102.

As also noted, indicia display 102 includes a pleasing back drop indicia region 102D which can become a readily replaceable branding region 102E (e.g. a tree in this example) that may be separately controlled via management system 101 or via the remote communication system 112 depending upon a display contract to enhance advertising revenues.

In one exemplary scenario, indicia display branding region 102E may be 'sold' or rented to a principal advertiser at a rate Alpha, while display portions 102A in backdrop indicial region 102D may be 'sold' or rented to a partner advertiser or subsidiary at a second rate Beta, while other module region 102F may be 'sold' to a local advertiser at a third rate Gamma. In this way, display management system 100 enables subdivision of display indicia for financial reasons that are enabled by the electrical and mechanical embodiments discussed herein.

As used herein, each display portion 102A is replaceable and contains solar module portions 102B that are separately controlled and feed power to electrical or electronic management system 101. In this way, management system 100 may enable certain solar module portions in units 102B to operate as solar energy collectors displaying a first color indicia, and management system 100 may enable other module portions 102C to be changed to a second color indicia so as to enable a pixel-type or other arrangement creating the desired overall display indicia.

It will be recognized by those of skill in the electronic design and engineering arts, that the solar arrays, modules and cells herein, and any indicia enhancements such as the light filters, covering flaps, or rotating motors, may all be electronically controlled by CPU 107 and transmit generated electronic power to a DC current management system (not shown) in electric or electronic management system 101 allowing system 100 to be self-powered. The display system 100 may or may not be connected to the public electrical grid 111 or may be connected directly to the owner's electrical system or may be used to power elements connected directly to the display system 100. Where connected to the electrical grid 111 via grid connection 110, the system 100 may supply power back to the grid 111 or draw power from the grid 111 upon demand.

FIG. 2A shows another embodiment of the display system 100, in which solar modules 102B and other modules 102C may be mounted on a multi-sided triangular- or other-shaped column 207, itself operated by a mechanical switching system 107A. Column 207 may rotate around a pivot axis to display different surfaces based on solar-tracking or image display or other timing considerations. Lighting elements 212 inside the column may be used to create a backlighting effect for the display surfaces. The ground or building support member 103A or the display frame/backing 103B may or may not have attached lighting fixtures 213 which may be powered by battery 115 or by external source (not shown).

In the embodiment shown in FIG. 2A, the individual faces 102B and 102C of the column 207 are varied in material and image. Column faces 102B may comprise PV material and collectively depict an image 205 (e.g., a car). Column faces 102C may comprise other material and collectively depict another image 204 (e.g., a canopy) or 206 (e.g., an eye). This embodiment of the display system is controlled such that column faces 102B track the sun during the course of the day to maximize the photovoltaic energy produced. At night, one of the other material faces 102C may be displayed. In general application, any of the column surfaces (whether triangular or another shape) may consist of either PV or other material and may contain display indicia or not.

In another embodiment shown in FIG. 2B, the columns 207 are held in a fixed position throughout the day with column faces 102B and column faces 102C being visible. FIG. 2C shows an image 205 (e.g., a car) that is visible from the left of the display (standing facing the display). FIG. 2D shows the combined image of a first image 205 (e.g., a car) and a second image 206 (e.g., an eye), which is visible from a vantage point that is directly in front of the display. FIG. 2E shows the image 206 (e.g., an eye) that is visible from the right side of the display. At night, the column faces 102C may be displayed to show the canopy image 204 (night view not depicted here). In FIGS. 2C-2E, indicia may be placed or shown on the frame or backing 103B as well as on the display 102.

FIG. 3A depicts another embodiment of the display system with an angled array with alternating solar energy generating portions 102B and display indicia portions 102C. This embodiment may also include any of the features from the embodiment depicted in FIGS. 2A-2E. The exploded portion of FIG. 3A shows the relative dimensions (length, width, height, angle of inclination) may vary for the solar module portions 102B and the other portions 102C, as seen by exemplary display embodiment cross sections 302 and 303. Display embodiment cross section 304 combines the rotating triangular columns 207 and tilted solar PV modules 102B to create an indicial display.

FIG. 3B is a dimensional view of the indicia display 102 showing the detail of this embodiment of the design. In general application, the solar module portions 102B and the other module portion 102C of the display may or may not include display indicia. In the embodiment in FIG. 3B, the module portions 102B appear as upward tilting, horizontal faces of the display while the display indicia are placed on the downward facing other module portions 102C of the display 102. Lighting elements 212 are placed behind the display portions to create a backlighting effect.

FIG. 3C illustrates the view of the display from the perspective of someone standing beneath the display. FIG. 3C is a variant of the proposed system having a reflective system, wherein one or more reflective members 306 may be employed to reflect solar energy where display surface 102 is positioned in a solar-energy-compromised position for display efficacy. For example, where the direct to the public is not due South, a reflector may be employed to enhance energy gain. As additionally discussed, drive motors (not shown) operative connected with reflective panels 306 may be computer controlled to drive or rotate the panels to enhance reflectivity along two or more axes during use. Such use of drive motors is applicable to any and all embodiments of the display system 100. The drive motors are not limited to use with reflective panels 306 but may also be incorporated for the purposes of rotating or otherwise moving display portions 102A.

FIGS. 4A, 4B, 4C, 4D, 4E and 4F show several potential configurations for inter-spacing the solar module portions 102B and the other module portions 102C within an indicia display 102. As noted herein, alternating other module portions 102C with indicia can be inter-spaced with energy generating solar module portions 102B in a manner that is effective to project the desired display indicia but also operatively effective to enable the generation of solar power. Alternatively, other module portions 102C and solar module portions may comprise indicia for the display (as shown in FIG. 4C). In this system, it will be noted that the solar module portions 102B may be partial solar or may be of a pixilated-type or dot matrix-type (discussed herein below), or any other means of customizing solar modules, discussed herein such that the portions are also able to be employed to display complementary indicia not simply a uniform solar array.

FIG. 4A shows solar module portions 102B and other module portions 102C in a horizontal configuration. FIG. 4B shows solar module portions 102B and other module portions 102C in a diagonal configuration. FIG. 4C shows solar module portions 102B and other module portions 102C in a vertical configuration. FIG. 4D shows solar module portions 102B and other module portions 102C in an alternating grid pattern. FIG. 4E shows solar module portions 102B and other portions 102C in a random grid pattern. Both uniform and non-uniform patterns with solar module portions 102B and other module portions 102C can vary in size and shape. FIG. 4F shows a vertical cross-section along A-A of the indicia display in FIG. 4C. The cross-section in FIG. 4F illustrates the use of internal lighting elements 212 mounted on the frame or backing 103B of the display to create a visible lighting effect through the other module portions 102C of the display.

As noted herein, photovoltaic laminate (PVL) modules and other thin-film solar technologies are flexible and may be mounted or incorporated into/onto a flexible medium that supports the array in combination with display materials in a manner within the scope and field of the present inventions. As such, another embodiment of the indicia display is shown in FIGS. 5A, 5B, 5C, 5D and 5E, wherein the use of the PVL technology, which is now being adapted to avoid formation of an opaque solar module within a monolithic flexible medium such that a translucent or transparent portion (or colored portion), may be inserted between integrated films. This system 500 of creating indicia displays by integrating PVL or other thin-film technologies into a flexible medium will be discussed herein.

FIGS. 5A and 5B depict various views of a flexible form of the PVL module or thin-film embodiment of the display. FIGS. 5C and 5D depict various views of a rigid form of the PVL module or other thin film embodiment of the display. The rigid form may be achieved by mounting the display on a frame or backing 103B or by other means. In these embodiments, the indicia may be placed on the surface of a flexible or rigid enclosing polymer films 501 or 512 or within the layers as described herein below.

As shown in the display section shown in FIG. 5E, a PVL film or other thin film member 500 involves opposing faces of flexible enclosing polymer films 501 and 512 that may be formed of translucent or transparent media. There between polymer films 501 and 512 are portions, regions or sections of amorphous solar structures 102B, each electrically connected in series, in parallel, or in any sequence via electrical connectors 503 with a lead connector 503A to a power collector and integrated circuit system 504. Those of skill in the art will know and recognize that these examples shall not be limiting on the concepts discussed herein or above, but are merely representative and adaptive embodiments for a particular circumstance.

During formation it is now recognized that regions 102C may be formed that exclude the solar structures 102B, allowing the use of a back-lighting system 511 to transmit light there through. It will be recognized by those of skill in the art of construction and design after study of this summary that the shapes, sizes, dimensions, and contents for regions 102C may be adapted to the desired indicia. For example, a transparent color filter or film may be employed instead, or an imagery outline member may be employed comprising a transparent medium region and an opaque or colored region so that backlight system 511 will project images or indicia for public viewing.

A further variation of the PVL or other thin film embodiment of the indicia display, is where particular displays may be formed with various mechanical or electrical systems to assist display of a first or second color indicia to aid the pixel-like creation of a determined display indicia. Layers 501 and 512 may be electronic light filters (LCD or quarter ¼-wave plate type filter) that is electronically switchable from opaque (shows the opaque second color) to clear (shows the color of the underlying amorphous solar structures 102B and translucent or transparent media 501 and 512). This is an example of an electronic-swapping or switching system controllable by central processing unit 107 as directed by display management system 100 described above and depicted in, for example, FIGS. 1B and 1C.

FIGS. 6A, 6B and 6C shows an embodiment of suspended media (e.g. flag, banner) for a thin-film or polycrystalline application in which the display is mounted on a frame or backing 103B. The display comprises solid structural portions 102C and solar module portions 102B, which together are used to create the desired indicia display. The solid structure portions may be constructed of extruded aluminum, or any other material, and may be of any color to create desired display indicia. Raised indicia portions 603, depicted as stars therein, may depict any object or image. FIG. 6C is a section view along A-A of a portion of the display that includes solar module portions 102B and structural portions 102C. FIG. 6B is a section view along A-A of a portion of the display that also includes raised indicia portions 603 mounted on a support 602. Both the raised indicia portion 603 and the support 602 may be made of extruded aluminum or any other material.

As noted and discussed, visual displays of any flag or other suspended media may be adapted according to the present method and systems to include one or more solar cell structures and LED lights or other colored members that may be employed variously to represent flag images or any other image. As noted, projected members may be employed to represent depth, and these may be employed on a controlled-motion basis (a mechanical or electrical actuator) to move relative to an underlying support to further enhance the display indicia.

Figure 7A:
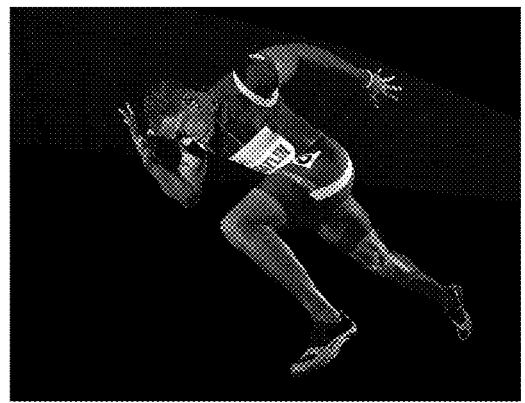

FIGS. 7A, 7B, 8A and 8B show an exemplary method for selecting and pixel mapping an indicia display for solar modules and other modules in a manner noted herein and within the skill of the art for those having studied the entire disclosure herein. FIGS. 7A, 7B, and 8A are exemplary embodiments of a flexibly suspended indicia display 800, with changeable indicia portions 802. The solar modules are selected (FIG. 8B) to represent a pixilated type imagery from the initial determination and construction steps 1100A-1100F described herein below. The solar arrays may be rigid or flexible depending upon design choice and will be constructed to have an image indicia portion that is integrally formed with the construction design in a pixilated manner.

FIGS. 7A and 7B show stages in the process of creating display indicia in a pixilated manner. FIG. 7A is a grayscale image of the desired display indicia. As shown in FIG. 7B, next the image is pixilated and mapped to a solar array (as seen in FIG. 8A) to be used for the indicia display 102 (e.g., FIG. 1). FIG. 8B is a close-up portion of the flexibly suspended indicia display 800 shown in FIG. 8A. Individual modules or solar module portions 102B or other module portions 102C may be assembled to form uniform indicia regions of a solar array modules 102B.

Additionally, using the step of determining a display indicia 1100A (FIG. 11), changeable indicia portions 802 of the larger display 800 may selected to have portions of uniform standard PV modules 803, other module portions 102C and/ or portions of custom modules having pixilated partial solar and other regions 804. The pixilated solar portions 102B or the pixilated other portions 102C within the custom pixilated module 804 may be of varied size and dimension to create the visual details of the display image or indicia. In this way, the entire surface of the display 800 may be adaptively integrated as the solar array where the original design is readily assembled into a specific display pattern to form a desired pixilated image when viewed by the viewing-public from a distance.

As additionally noted, a changeable indicia portion 802 (similar to original branding region 102E (FIG. 1) may be integrated into the overall indicia display 102 so that during a low ambient light situation a light element 212 (not shown) within the display is enhanced to attract public attention.

FIGS. 9A, 9B, 9C, 9D, 9E, 9F, 9G, 9H and 9I are further illustrations showing the stages in the process of creating display indicia in a dot matrix, graphic style, or otherwise customized manner. FIGS. 9D-9G show how the display arrays and custom panels are constructed along the lines discussed herein. FIG. 9A illustrates the way traditional solar panels/modules 803 and custom solar panels/modules 903 may be arranged together with in a method to construct a display system 1100F (FIG. 11).

Traditional solar modules comprise PV solar cells 901 (FIG. 9I) and are typically arranged in a grid pattern within a solar module 803. Custom solar photovoltaic (PV) dot matrix-type modules 903 comprise PV solar cells 901 and other cells 902 which may or may not be made of any opaque or translucent material. The placement of the solar PV cells 901 and other cells 902 enables the design of a dot matrix image, represented by the display embodiment in FIG. 9A. In this example, the arrangement of cells 901 and 902 may be evenly spaced according to a grid pattern (as indicated in FIG. 9F).

FIG. 9C is another embodiment of a dot matrix-type image display. In this example there is an irregular placement or concentration of solar cells 901 and throughout the overall the display. The display is comprised of custom dot matrix-type modules 907 (illustrated in FIG. 9G) that may individually, or collectively, create the display image. In this example, solar cells 901 and other cells 902 are irregularly or randomly spaced or placed (as seen in FIG. 9G).

FIG. 9B is an illustration of the way traditional solar modules 803 and custom modules 904 may be arranged together in a method to construct a display system 1100F (FIG. 11). Custom solar PV modules 904 may be comprised of traditional solar cells 901 and modified solar cells 906 (FIG. 9H). The modified solar cells 906 may be covered with an adhesive surface layer (with opaque and translucent areas), may be covered with a glass surface, or may contain an internal image/portion of an image, may be comprised of solar material of different light transmitting qualities or light refractive qualities, or may employ any other method of creating visibly distinguishable regions within the cell.

In each of the embodiments shown in FIGS. 9A-9C, the arrays of custom modules 903, 904 and 907 and traditional modules 803 within the display may be illuminated from behind with a lighting element (not shown) or a back light (not shown) or other means.

In creating desired display indicia, any number of modules 803, 903, 904 and 907 may be used in whole or in part. Similarly, the placement of whole or partial modules or panels within a display may follow a regular pattern (e.g. grid) or may be irregular or random, or any other combination or configuration as selected to create a required indicia, design or display.

Specific details about the method for constructing the custom solar photovoltaic modules, including but not limited to pixilated type 804, dot matrix type 903 and 907, or the image included type 904, is similarly integral with the above discussion and those of skill in the art will need no further comment.

FIGS. 10A, 10B, 10C and 10D depict illustrated descriptions of solar and display or promotional features incorporated into a performance or display stage circumstances. In these exemplary embodiments, a flexibly suspended indicia display 800, as discussed above, is physically adapted to the stage or presentation-geometries shown in FIGS. 10A-10D.

In FIG. 10A, the flexibly suspended indicia display system 800 is incorporated into the support and walking surface itself with a protective cover and a plurality of alternative display features worked into the surface so as to present display indicia to the viewing public or those on the support or walking surface. In the display geometry noted in FIG. 10B, the flexibly suspended indicia display system 800 is incorporated into the support surface and no protective scuff-coating is necessary. The method of creating the indicia display may include but is not limited to incorporating custom solar modules 903 (as illustrated in FIG. 10A), non-PV module portions 102C (as illustrated in FIG. 10B), or any other indicia display creating methods noted herein. Flexible or rigid, pixel-capable or dot matrix-capable, or other display features noted above may be readily designed, manufactured, installed, and tested without departing from the scope and spirit of the present invention.

In display geometries embodied in FIGS. 10C-10D, the system of creating indicia displays by integrating PVL or other thin-film technologies into a flexible medium 500 (FIG. 5) is incorporated into the protective/decorative cover or tent-like roofing surface of the display stage so as to present display indicia to the viewing public.

FIG. 11 illustrates a method 1100 for selecting and manufacturing a display having solar indicia as discussed herein. FIG. 11 shows an initial step of determining a desired display indicia 1100A, then determining, based on step 1100A, a second step of selecting a desired display management system for use in step 1100B. The display management system 100 that is selected in step 1100B should be determined to meet the engineering, architectural, and site aesthetic requirements, client requirements, and economic standards set in step 1100A.

In determining desired display management system 1100B, operators of operational method 1100 should interact with electronic requirements 1100C, mechanical requirements 1100F, and locational requirements 1100E in order to form a cohesive determination.

The next step 1100F is to construct the now-determined display system and to install the display system in a step 1100G. It will be recognized that the step of installing the now-determined and constructed solar display system will involve integral testing steps 1100H. A remote management system step 1100I indicates a step of operational integration with the determined display management system 100 during a display overview step 1100J.

In this way, those of skill in the management arts having studied the complete disclosure herein will recognize that a method is provided for determining, constructing, installing, testing, and operating the proposed display system.

As will be understood hereafter, the type of display system (determined, constructed, installed, tested, and managed or operated) depends upon the circumstances and may include a large billboard, a stalk-type display, a flexible display or even a greatly simplified automatic power-generation display that does not have a central processing unit (CPU).

It will also be understood by those of skill in the art that the suggested CPU 107 will include those components necessary to operate as required for display management system 100, including, but not limited to, an electronic memory system, a processor, one or more software programs, USB, or extra-system interface ability for installing, updating, and downloading data.

As will be further understood by those of skill in the art, mechanical management system 104 will include those components necessary to operate as required for display management system 100, optionally including wind load sensors, movement systems with tensioners, stress or motion dampers, flip or motion controllers, pivots for wind orientation, or other electro-mechanical-pneumatic-or hydraulic systems to enable a desired operation of display management system 100 and display 102.

Discussed herein and depicted in the figures are a number of specific examples of adaptive display and indicia systems involving solar arrangements. Those of skill in the art will recognize that these examples shall not be limiting on the concepts discussed herein or above, but are merely representative and adaptive embodiments for a particular circumstance. It will be recognized that these examples are illustrative to those of skill in the art.

While no specific solar module, or solar cell product, is specified in the above discussion, it is proposed that none is needed, as those skilled in the art of solar array architecture and engineering have ready access to a diverse range of products. A known solar laminate product is the Solar Laminate PLV-Series, Model PLV-136 supplied by Uni-Solar Ovonic LLC of 3800 Lapeer Rd., Auburn Hills, Mich. 48326, which notes a flexible roll of operatively joined amorphous silicon cells linked in series with projecting leads for joining into a larger array.

It will be additionally recognized herein that while the phrase solar panel, solar module, solar array or solar cell is employed, the flexible and rigid solar systems discussed allow the creation of solar-active regions in any desirable shape, any non-uniform or uniform shape, and the clear creation of a large array where there are intentionally non-solar portions (see, for example, FIGS. 8A, 8B, 9A and 9B). Where these assemblies are on a flexible medium, such as a large textile or film support backing for suspending on the side of a building or to be stretched between tensioning mechanisms, it will be recognized that the utility of a flexible textile or film support can be used itself as a display indicia. For example, the suspension may be in a non-linear manner, in a twisted or helix-type manner, or in about a rounded surface such as an arc, curve, or foil. In this way, the proposed invention and one or more of the proposed embodiments may be creatively adapted to any desired display or advertising scenario or environment.

As employed herein, those of skill in the art of solar power generation will recognize distinctions between the phrases array, cell, module, amorphous, and crystalline. However, it will be recognized by those of skill in the art, that when viewed in the particular exemplary circumstance, the use of array or module or cell may be interchanged without restriction or confusion.

As employed herein the phrase indicia or display indicia shall be interpreted broadly to represent the visual or even audio presentation of an image that the displayer desires to display. As an example, a display indicia may be the image of a large building-hung political slogan or image of a political candidate that can be viewed by the public. Similarly, an indicia as employed herein will be recognized as also being a stylized flag, wherein a solar component interacts and enables a visual component that can be viewed by the public. This type of stylized flag may be sold separately to the public for individual pleasure or may be employed by an organization (for example, a political campaign organization) to stimulate a feeling of patriotism for their candidate.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies on friction between a wooden part and a cylindrical surface, a screw's helical surface positively engages the wooden part, and a bolt's head and nut compress opposite sides of a wooden part, in the environment of fastening wooden parts, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A solar power generation display assembly comprising:
   an indicia display having a front surface, a back surface, a first end, a second end, a top end and a bottom end, said indicia display comprising:
      a plurality of solar modules comprising solar module portions;
      a plurality of other modules comprising other module portions;
      said plurality of other module portions being arranged so that they are in the form of first design elements;
      said plurality of solar module portions being arranged so that they are in the form of second design elements; and
      said portion of said plurality of solar module portions and said portion of said plurality of said other module portions arranged in a design to form a designated indicia made up of said first design elements and said second design elements; and
   a framing or backing element.

2. A solar power generation display assembly according to claim 1 further comprising at least one support structure.

3. A solar power generation display assembly according to claim 1 wherein said front surface of said indicia display further comprises at least two multi-sided displays having at least two sides, wherein said plurality of solar module portions are disposed on at least one of said sides of said multi-sided displays and said plurality of other module portions are disposed on at least one of another of said sides of said multi-sided displays.

4. A solar power generation display assembly according to claim 3 wherein said multi-sided displays having at least three sides and further comprise rotational elements to permit said multi-sided displays to rotate around a pivot axis in order to display different sides of said multi-sided displays.

5. A solar power generation display assembly according to claim 4 wherein said multi-sided displays are rotated based on at least one of solar-tracking, image display and/or timing considerations.

6. A solar power generation display assembly according to claim 1 wherein said plurality of other modules comprises a plurality of solar module portions comprising at least one of photovoltaic cells, photovoltaic thin film, light concentrator type of solar panel and/or solar thermal.

7. A solar power generation display assembly according to claim 1 wherein said assembly is in the form of a billboard.

8. A solar power generation display assembly according to claim 1 wherein said assembly is in the form of a stage or stage elements.

9. A solar power generation display assembly according to claim 2 wherein said support structure comprises at least one support column having a first end connected to a ground surface and extending substantially vertically along a longitudinal axis from said first end to a second end and further comprises at least one second support structure disposed at said second end of said support column of said first support structure, said second support structure configured so as to provide support for said indicia display and framing element.

10. A solar power generation display assembly according to claim 1 wherein said indicia display is in the shape of a rectangle, wherein said first end and said second end represent the shorter sides of said rectangle running vertically and said top end and said bottom end represent the longer sides of said rectangle running horizontally;
said plurality of solar module portions being arranged so that a first portion of said plurality of said solar module portions is in the shape of a square having a first end, a second end, a top end and a bottom end, wherein said first end and said second end of said first portion of said plurality of said solar module portions run vertically and said top end and said bottom end run horizontally, said square being located so that said first end of said square is adjacent to said first end of said rectangle and said top end of said square is adjacent to said top end of said rectangle, said square sized so as to take up a portion of said rectangle;
said plurality of solar module portions further being arranged so that a second portion of said plurality of solar module portions is in the shape of linear strips extending horizontally from said second end of said square to said second end of said rectangle and, where said square is not present, extending horizontally from said first end of said rectangle to said second end of said rectangle;
said plurality other module portions being arranged so that a first portion of said plurality of said other module portions is in the form of stars, said stars being interspersed in said square;
said first portion of said plurality of solar power array portions and said first portion of said plurality of said other module portions having first features that distinguish one from the other;
said plurality other module portions being arranged so that a second portion of said plurality of said other module portions is in the shape of linear strips extending horizontally from said second end of said square to said second end of said rectangle and, where said square is not present, extending from said first end of said rectangle horizontally to said second end of said rectangle;
said second portion of said plurality of solar module portions and said second portion of said plurality of said other module portions arranged in an alternating fashion; and
said second portion of said plurality of solar module portions and said second portion of said plurality of said other module portions having second features that distinguish one from the other.

11. A solar power generation display assembly according to claim 1 wherein said first features and/or said second features comprise at least one of color, texture, text, advertising elements, promotional elements, lighting elements, photographic elements, lithographic elements, electronic or electrical elements and/or decorative elements.

12. A solar power generation display assembly according to claim 1 wherein said first design elements and/or said second design elements are in the form of at least one of dot matrix type design, pixilated type design, grid design and/or panel design.

13. A method for providing a solar power generation display assembly comprising:
determining a display material for an indicia display;
determining first design elements for said display material;
determining second design elements for said display material;
providing an assembly comprising said indicia display having a front surface, a back surface, a first end, a second end, a top end and a bottom end, said indicia display comprising:
a plurality of solar modules comprising solar module portions;
a plurality of other modules comprising other module portions;
said plurality of other module portions being arranged so that they are in the form of first design elements;
said plurality of solar module portions being arranged so that they are in the form of second design elements; and
said portion of said plurality of solar module portions and said portion of said plurality of said other module portions arranged in a pattern to form a designated indicia made up of said first design elements and said second design elements; and
a framing or backing element constructing said indicia display.

14. A method for providing a solar power generation display assembly of claim 13 further comprising providing an assembly further comprising at least one support structure.

15. A method for providing a solar power generation display assembly of claim 13 wherein said plurality of other modules comprises a plurality of solar module portions comprising photovoltaic cells, photovoltaic thin film, light concentrator type of solar panel and/or solar thermal.

16. A method for providing a solar power generation display assembly of claim 13 wherein said assembly is in the form of a billboard.

17. A method for providing a solar power generation display assembly of claim 13 wherein said assembly is in the form of a stage or stage elements.

18. A method for providing a solar power generation display assembly of claim 14 wherein said support structure comprises at least one support column having a first end connected to a ground surface and extending substantially vertically along a longitudinal axis from said first end to a second end and further comprises at least one second support structure disposed at said second end of said support column of said first support structure, said second support structure configured so as to provide support for said indicia display and framing element.

19. A method for providing a solar power generation display assembly of claim 13 wherein said first features and/or said second features comprise at least one of color, texture, text, advertising elements, promotional elements, lighting elements, photographic elements, lithographic elements, electronic or electrical elements and/or decorative elements.

20. A method for providing a solar power generation display assembly of claim 13 wherein said first design elements and/or said second design elements are in the form of at least one of dot matrix type design, pixilated type design, grid design and/or panel design.

21. A system for operating a solar power generation display assembly comprising:
- at least one programmable display management system;
- at least one display material for an indicia display;
- first design elements for said display material;
- second design elements for said display material;
- an assembly comprising said indicia display having a front surface, a back surface, a first end, a second end, a top end and a bottom end, said indicia display comprising:
  - a plurality of solar modules comprising solar module portions;
  - a plurality of other modules comprising other module portions;
  - said plurality of other module portions being arranged so that they are in the form of first design elements;
  - said plurality of solar module portions being arranged so that they are in the form of second design elements; and
  - said portion of said plurality of solar module portions and said portion of said plurality of said other module portions arranged in a pattern to form a designated indicia made up of said first design elements and said second design elements; and
- a framing or backing element.

* * * * *